United States Patent
Lee et al.

(10) Patent No.: US 9,601,722 B2
(45) Date of Patent: Mar. 21, 2017

(54) METHOD OF MANUFACTURING DISPLAY DEVICE INCLUDING A SURFACE TREATMENT OPERATION TO REMOVE ACTIVATED FLUORINE

(71) Applicant: SAMSUNG DISPLAY CO., LTD., Yongin-si, Gyeonggi-do (KR)

(72) Inventors: Sunhye Lee, Suwon-si (KR); Wonjun Song, Hwaseong-si (KR); Myungjong Jung, Yongin-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 15/076,692

(22) Filed: Mar. 22, 2016

(65) Prior Publication Data
US 2017/0047556 A1    Feb. 16, 2017

(30) Foreign Application Priority Data
Aug. 11, 2015    (KR) .......................... 10-2015-0113452

(51) Int. Cl.
*H01L 51/56*    (2006.01)
*H01L 27/32*    (2006.01)

(52) U.S. Cl.
CPC .......... *H01L 51/56* (2013.01); *H01L 27/3246* (2013.01)

(58) Field of Classification Search
CPC combination set(s) only.
See application file for complete search history.

(56) References Cited

U.S. PATENT DOCUMENTS

| 8,383,208 | B2 | 2/2013 | Kim et al. | |
| 2008/0237660 | A1* | 10/2008 | Sharma | C30B 1/023 257/288 |
| 2009/0056589 | A1* | 3/2009 | Guiheen | C08J 7/06 106/285 |
| 2011/0318919 | A1* | 12/2011 | Horigome | H01L 21/02115 438/653 |
| 2014/0193964 | A1* | 7/2014 | Liu | H01L 21/3225 438/473 |

(Continued)

FOREIGN PATENT DOCUMENTS

| JP | 2010-153085 | 7/2010 |
| KR | 10-2006-0032171 A | 4/2006 |

(Continued)

*Primary Examiner* — Mamadou Diallo
(74) *Attorney, Agent, or Firm* — Lee & Morse, P.C.

(57) ABSTRACT

A method of manufacturing a display device, the method including providing a first electrode on a base substrate; providing a fluorine-containing pixel defining layer on the base substrate and the first electrode such that the pixel defining layer exposes at least a portion of the first electrode; pretreating the first electrode; and providing an organic layer on the first electrode after pretreating the first electrode, wherein pretreating the first electrode includes performing a first treatment operation of treating an exposed surface of the first electrode using a first plasma gas; and performing a second treatment operation after performing the first treatment operation, the second treatment operation including treating the exposed surface of the first electrode using a second plasma gas, wherein the second plasma gas is different from the first plasma gas and includes hydrogen.

16 Claims, 8 Drawing Sheets

(56) References Cited

U.S. PATENT DOCUMENTS

2014/0227454 A1* 8/2014 Matsumoto .............. B01J 37/08
427/535

FOREIGN PATENT DOCUMENTS

| KR | 10-2006-0038371 A | 5/2006 |
| KR | 10-2015-0012548 A | 2/2015 |
| KR | 10-2016-0069557 A | 6/2016 |

* cited by examiner

METHOD OF MANUFACTURING DISPLAY DEVICE INCLUDING A SURFACE TREATMENT OPERATION TO REMOVE ACTIVATED FLUORINE

CROSS-REFERENCE TO RELATED APPLICATION

Korean Patent Application No. 10-2015-0113452, filed on Aug. 11, 2015, in the Korean Intellectual Property Office, and entitled: "Method of Manufacturing Display Device," is incorporated by reference herein in its entirety.

BACKGROUND

1. Field

Embodiments relate to a method of manufacturing a display device.

2. Description of the Related Art

A flat display device may include a light-emitting type or a light-receiving type. The light-emitting type flat display device may include a flat cathode ray tube, a plasma display panel, an organic light emitting display (OLED), and the like. The organic light emitting display that is a self-light emitting type display, may have advantages of a wide viewing angle, an excellent contrast, and a fast response rate.

Accordingly, the organic light emitting display may be applied to a display device for, e.g., a mobile device: a digital camera; a video camera; a camcorder; a personal digital assistant; a smart phone; an ultra-thin notebook; a tablet personal computer; a flexible display device; or the like, a large electronic product: an ultra-thin television; or the like, or a large electrical product, and is thus spotlighted.

The organic light emitting display may realize colors by using a principle in which a hole and an electron injected from a first electrode and a second electrode are recombined in an emitting layer to emit light and light is emitted when an exciton in which the injected hole and electron are combined transits from an excited state to a ground state.

SUMMARY

Embodiments are directed to a method of manufacturing a display device.

The embodiments may be realized by providing a method of manufacturing a display device, the method including providing a first electrode on a base substrate; providing a fluorine-containing pixel defining layer on the base substrate and the first electrode such that the pixel defining layer exposes at least a portion of the first electrode; pretreating the first electrode; and providing an organic layer on the first electrode after pretreating the first electrode, wherein pretreating the first electrode includes performing a first treatment operation of treating an exposed surface of the first electrode using a first plasma gas; and performing a second treatment operation after performing the first treatment operation, the second treatment operation including treating the exposed surface of the first electrode using a second plasma gas, wherein the second plasma gas is different from the first plasma gas and includes hydrogen.

The first plasma gas may include a mixed gas of $N_2$ and $O_2$, and the second plasma gas may include a mixed gas of $N_2$ and $H_2$.

A ratio of $H_2$ in the mixed gas of $N_2$ and $H_2$ may be about 10% to about 30%.

The first treatment operation may be performed for about 35 seconds to about 45 seconds, and the second treatment operation may be performed for about 15 seconds to about 25 seconds.

A power applied in the second treatment operation may be lower than a power applied in the first treatment operation.

A power applied in the first treatment operation may be about 700 W to about 900 W, and a power applied in the second treatment operation may be about 300 W to about 600 W.

Performing the first treatment operation may include removing a residual material from the exposed surface of the first electrode, the residual material having been created during providing the pixel defining layer, and performing the second treatment may include removing a fluoride ion from the exposed surface of the first electrode, the fluoride ion having been created during the first treatment operation.

Performing the second treatment operation may include forming a hydrogen bond between the fluoride ion and the second plasma gas.

The embodiments may be realized by providing a method of manufacturing a display device, the method including preparing a substrate that contains fluorine; pretreating the substrate; and providing an organic layer on the substrate after pretreating the substrate, wherein pretreating the substrate includes performing a first treatment operation of treating a surface of the substrate using a first plasma gas; and performing a second treatment operation after performing the first treatment operation, the second treatment operation including treating the surface of the substrate using a second plasma gas, wherein the second plasma gas is different from the first plasma gas and includes hydrogen.

The first plasma gas may include a mixed gas of $N_2$ and $O_2$, and the second plasma gas may include a mixed gas of $N_2$ and $H_2$.

A ratio of $H_2$ in the mixed gas of $N_2$ and $H_2$ may be about 10% to about 30%.

The first treatment operation may be performed for about 35 seconds to about 45 seconds, and the second treatment operation may be performed for about 15 seconds to about 25 seconds.

A power applied in the second treatment operation may be lower than a power applied in the first treatment operation.

A power applied in the first treatment operation may be about 700 W to about 900 W, and a power applied in the second treatment operation may be about 300 W to about 600 W.

Performing the second treatment operation may include removing a fluoride ion from the surface of the substrate, the fluoride ion having been created in the first treatment operation.

Performing the second treatment operation may include forming a hydrogen bond between the fluoride ion and the second plasma gas.

BRIEF DESCRIPTION OF THE DRAWINGS

Features will be apparent to those of ordinary skill in the art by describing in detail exemplary embodiments with reference to the attached drawings in which.

DETAILED DESCRIPTION

Figure 1:
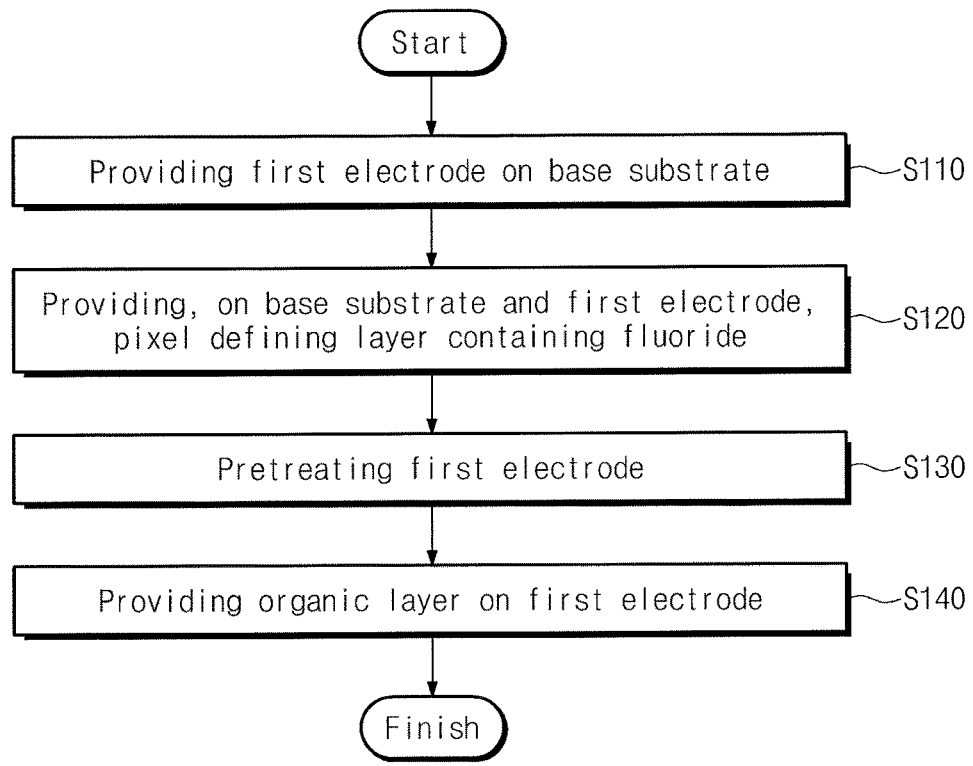
FIG. 1 schematically illustrates a flow diagram of a method of manufacturing a display device according to an embodiment, FIG. 2 schematically illustrates a flow diagram of a pretreating operation in a method of manufacturing a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In addition, it will also be understood that when an element is referred to as being "between" two elements, it can be the only element between the two elements, or one or more intervening elements may also be present.

In the drawings, like reference numerals refer to like elements throughout the specification. In the drawings, the dimensions of structures are exaggerated for clarity of illustration. Though terms like "first" and "second" may be used to describe various components, the components are not limited to these terms. These terms are used only to differentiate one component from another one. For example, without departing from the scope of the present disclosure, a first element could be termed a second element, and similarly has a second element could be termed a first element. A singular form, unless otherwise indicated, may include a plural form.

Throughout the specification, when it is said that a part "includes" or "have", it means that the part may further intend to designate features, integers, steps, operations, elements, components, or the combination thereof. Further, it means that one or more other features, integers, steps, operations, elements, parts or combinations thereof, or the additional possibility are not precluded. It will also be understood that when a layer, film, region, or a board is referred to as being 'on' another layer, film, region, or a board, it can be directly on the other layer, film, region, or a board, or intervening layers, films, regions, or boards may also be present.

Hereinafter, a method of manufacturing a display device according to an embodiment will be described.

First, a method of manufacturing a display device according to an embodiment will be described with reference to FIGS. 1 to 3E.

FIG. 1 schematically illustrates a flow diagram of a method of manufacturing a display device according to an embodiment.

Referring to FIGS. 1 and 3A to 3H, a method of manufacturing a display device according to an embodiment may include providing a first electrode EL1 on a base substrate BS (S110), providing (on the base substrate BS and the first electrode EL1) a fluorine-containing pixel defining layer PDL (exposing at least a portion of the first electrode EL1) (S120), pretreating the first electrode EL1 (S130), and providing an organic layer on the first electrode EL1 after pretreating the first electrode EL1 (S140).

Figure 3A:
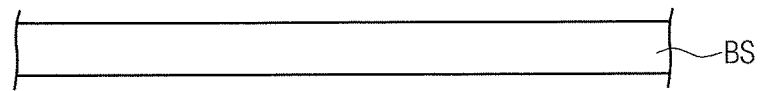
FIGS. 3A to 3H illustrate cross-sectional views of stages in a method of manufacturing a display device according to an embodiment, FIG. 4 schematically illustrates a flow diagram of a method of manufacturing a display device according to an embodiment, FIG. 5 schematically illustrates a flow diagram of a pretreating operation in a method of manufacturing a display device according to an embodiment.
Figure 3B:
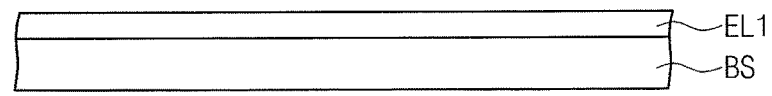

First, providing the first electrode EL1 on the base substrate BS (S110) may be performed as illustrated in FIGS. 3A and 3B. Providing the first electrode EL1 (S110) may be performed in a suitable manner.

A material forming the base substrate BS may include a suitable material, e.g., an insulating material such as glass, plastic, quartz, or an organic polymer. Examples of the organic polymer forming the base substrate BS may include polyethylene terephthalate (PET), polyethylene naphthalate (PEN), polyimide, polyether sulfone, and the like. The base substrate BS may be selected in consideration of mechanical strength, thermal stability, transparency, surface smoothness, easiness of handling, water resistance, or the like.

In an implementation, a stacked relationship between the base substrate BS and the first electrode EL1 may vary. For example, the first electrode EL1 may be provided only on a portion of the base substrate BS. In an implementation, other elements such as a substrate buffer layer, a passivation layer, or the like may be provided between the base substrate BS and the first electrode EL1.

The first electrode EL1 may exhibit conductivity. The first electrode EL1 may be a pixel electrode or an anode. The first electrode EL1 may be a transmissive electrode, a transflective electrode, or a reflective electrode. When the first electrode EL1 is a transmissive electrode, the first electrode EL1 may be formed of a transparent metal oxide, e.g., indium tin oxide (ITO), indium zinc oxide (IZO), zinc oxide (ZnO), or indium tin zinc oxide (ITZO). When the first electrode EL1 is a transflective electrode or a reflective electrode, the first electrode EL1 may include Ag, Mg, Al, Pt, Pd, Au, Ni, Nd, Ir, Cr, or a mixture thereof.

Figure 3C:
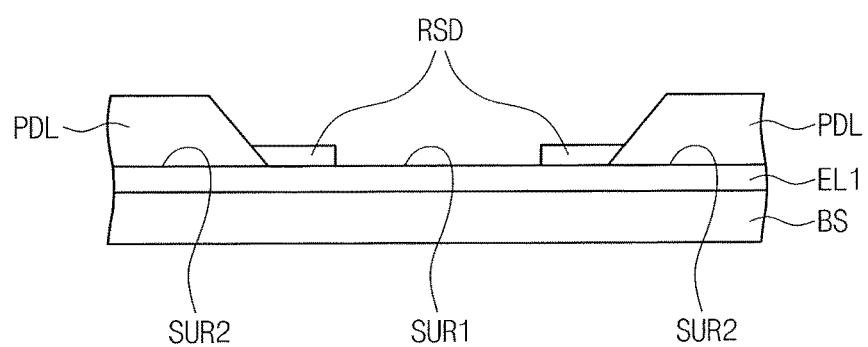

Next, referring to FIG. 3C, the fluorine-containing pixel defining layer may be formed on the base substrate BS and the first electrode EL1 (S120). The pixel defining layer may expose at least a portion of (e.g., a portion of a surface of) the first electrode EL1. The pixel defining layer PDL may partition a region of the base substrate BS to define pixel regions corresponding to respective pixels. The pixel defining layer PDL may expose a top surface of the first electrode EL1 and may project from the base substrate BS along a perimeter of each of the pixels. In an implementation, the pixel defining layer PDL may be formed in a single layer. In an implementation, the pixel defining layer PDL may have a stacked structure of one or more layers.

The pixel defining layer PDL may overlap a portion of the first electrode EL1 as viewed from above. In the present application, the term "as viewed from above" used herein may mean, e.g., when an object is viewed from a thickness direction.

A portion of a surface of the first electrode EL1 may be exposed by the pixel defining layer PDL. The surface of the first electrode EL1 may include a surface SUR1 exposed by the pixel defining layer PDL and a surface SUR2 overlapping or underlying the pixel defining layer (e.g., not to be exposed).

Forming the pixel defining layer PDL (S120) may include, e.g., using a material that includes fluorine. For example, the pixel defining layer PDL may include a polymer or polymer derivative including fluorine. In an implementation, the pixel defining layer PDL may include, e.g., a polyimide-based polymer, an acrylic polymer, and/or an olefin-based polymer, each of which includes fluorine. In an implementation, the pixel defining layer PDL may include, e.g., a metal-fluoride ion compound. In an implementation, the pixel defining layer PDL may be formed of a metal-fluoride ion compound, e.g., LiF, $BaF_2$, and/or CsF. When the pixel defining layer PDL has a predetermined thickness, the metal-fluoride ion compound may have an insulating property. In an implementation, a thickness of the pixel defining layer PDL may be, e.g., about 10 nm to about 100 nm.

Next, pretreating the first electrode EL1 may be performed. For example, pretreating a surface of the first electrode EL1 exposed by the pixel defining layer PDL may be performed.

Figure 2:
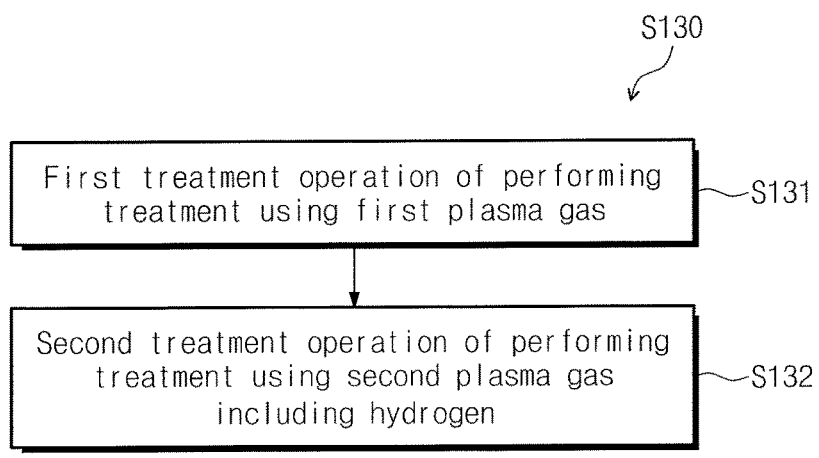

FIG. 2 schematically illustrates a flow diagram of a pretreating operation in a method of manufacturing a display device according to an embodiment.

Referring to FIGS. 2 and 3C to 3F, pretreating the first electrode EL1 (S130) may include performing a first treatment operation (S131) of first treating an exposed surface SUR1 of the first electrode EL1 using a first plasma gas PS1 and performing a second treatment operation (S132) of (e.g., again) treating the exposed surface SUR1 of the first electrode EL1 but using a second plasma gas PS2.

Each of the first and second treatment operations S131 and S132 may include a plasma treatment operation in which a gas is injected in a vacuum atmosphere to treat the surface of the first electrode EL1.

Figure 3D:
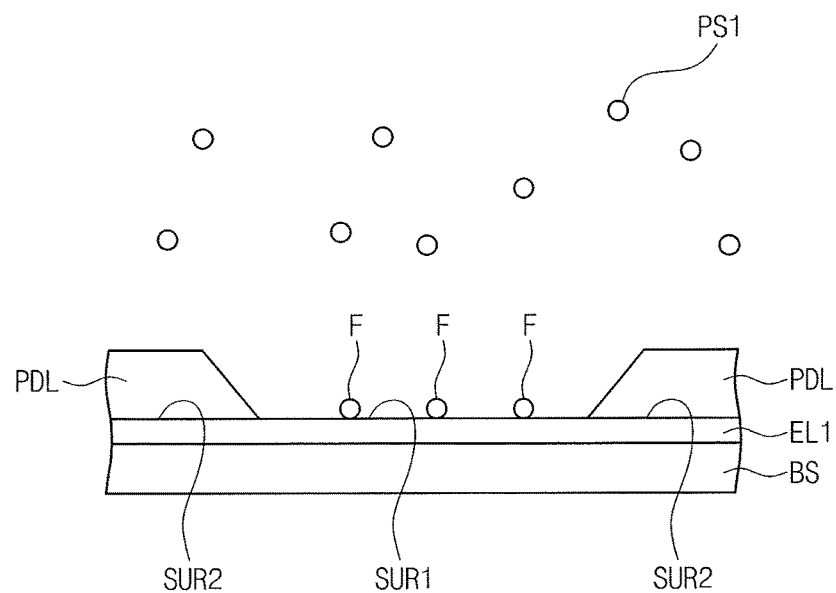
Figure 3E:
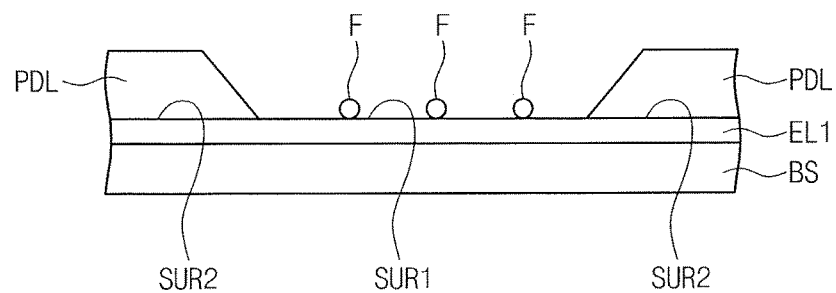

Referring to FIGS. 3C to 3E, the first treatment operation (S131) may include removing an undesired residue (residual material) RSD of the pixel defining layer remaining on (e.g., from) the surface SUR1 of the first electrode EL1 (exposed by the pixel defining layer PDL) after providing or forming the pixel defining layer PDL (S120). For example, the first treatment operation S131 may include an ashing process for removing the undesired residual material remaining on the surface SUR1 of the first electrode EL1 before providing the organic layer AL (see FIG. 3H) on the first electrode EL1. In an implementation, in addition to the above-described effect, the first treatment operation S131 may also include, e.g., an effect of improving an interface characteristic between the first electrode EL1 and the organic layer AL.

Figure 3F:
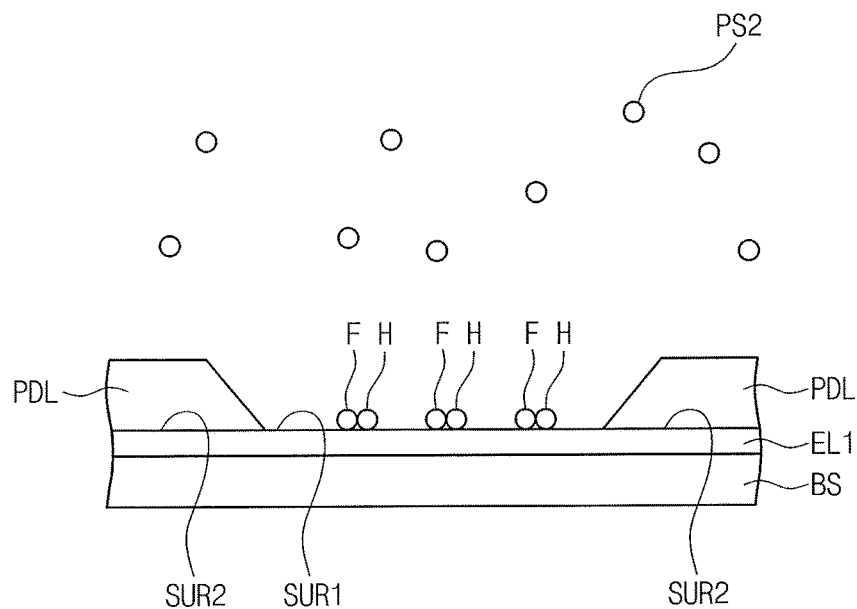
Figure 3G:
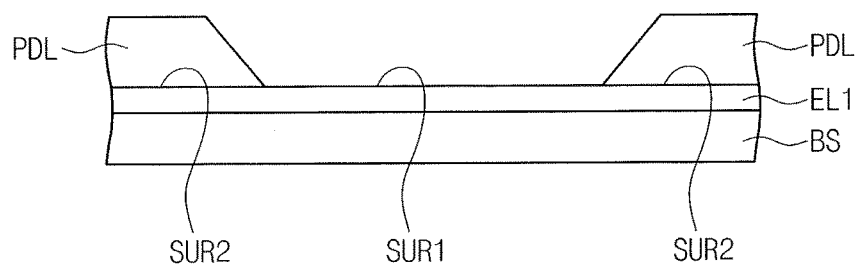

As described above, the pixel defining layer PDL on the base substrate BS and the first electrode EL1 may include a fluorine-containing material. Referring to FIGS. 3D and 3E, the fluorine of the pixel defining layer PDL may react with the first plasma gas PS1 in the first treatment operation (S131) to be changed into an activated fluoride ion. Some of the fluoride ions may remain on the surface of the first electrode EL1. If allowed to remain in the device, the activated fluoride ion could be a major cause of deterioration of the display device. Referring to FIGS. 3F and 3G, the second treatment operation S132 may include performing an operation in which the fluoride ion is removed in order to help prevent the display device from being deteriorated. For example, the first treatment operation S131 may be performed, and then the second treatment operation S132 (again treating the exposed surface SUR1 of the first electrode EL1) may be performed. In the second treatment operation S132, the fluoride ion F (which may be created during the first treatment operation S131 and that may remain on the surface SUR1 of the first electrode EL1) may be removed.

In some other methods of manufacturing devices, only a surface treatment operation (e.g., corresponding to the first treatment operation) may be performed to remove an impurity on the pixel defining layer before providing an organic layer on the first electrode. The present embodiment includes a further or additional surface treatment operation to remove the fluoride ion, e.g., to remove a main possible cause of deterioration of a display device, after a surface treatment operation for removing an impurity. Thus, the method according to an embodiment may have an advantage of being able to manufacture a display device with increased lifespan.

Due to a difference between the first and second treatment operations S131 and S132, the first plasma gas PS1 (for treating the surface SUR1 of the first electrode EL1 in the first treatment step S131) may be different from the second plasma gas PS2 (for treating the surface SUR1 of the first electrode EL1 in the second treatment step S132). For example, the second plasma gas PS2 may be for removing a fluoride ion F, and may be a gas including hydrogen.

In an implementation, the first plasma gas PS1 may be or may include, e.g., a mixed gas of $N_2$ and $O_2$. In an implementation, the second plasma gas PS2 may be or may include, e.g., a mixed gas of $N_2$ and $H_2$. As illustrated in FIG. 3F, hydrogen H included in the second plasma gas PS2 may form a hydrogen bond with the activated fluoride ion F (e.g., remaining) on the surface SUR1 of the first electrode EL1. In the second treatment operation S132, the fluoride ion F may be removed while or by forming a hydrogen bond with the second plasma gas.

In an implementation, a ratio or amount of $H_2$ in the mixed gas of $N_2$ and $H_2$, e.g., in the second plasma gas PS2, may be about 10% to about 30%. In an implementation, the ratio or amount of $H_2$ may be, e.g., about 20%. Maintaining the amount of $H_2$ in the second plasma gas at about 10% or greater may help ensure a sufficient effect of removing the activated fluoride ion. Maintaining the amount of $H_2$ in the second plasma gas at about 30% or less may help ensure a sufficient increase rate of an effect of removing the activated fluoride ion.

In an implementation, a ratio or amount of $H_2$ in the mixed gas of $N_2$ and $H_2$, e.g., in the second plasma gas PS2, may be about 10 vol % to about 30 vol %.

In an implementation, the first treatment operation (S131) may be performed for, e.g., about 35 seconds to about 45 seconds. In an implementation, the second treatment operation (S132) may be performed for, e.g., about 15 seconds to about 25 seconds. In some other methods, a pretreatment process may be performed for about 60 seconds before depositing the organic layer on the first electrode. Although the method of manufacturing a display device according to an embodiment performs two-stage pretreatment process, the method has an advantage in that there may be no increase in tack time by controlling the processing time of each stage.

The first and second treatment operations S131 and S132 may be plasma treatment operations treating the exposed surface SUR1 of the first electrode EL1 using the first and second plasma gases PS1 and PS2. In each stage, conditions such as pressure, flow, or electric power may be controlled.

In some other methods, the surface of the first electrode may be treated using a mixed gas (ratio of about 97.5:2.5) of $N_2$ and $O_2$ of about 100 sccm for about 60 seconds. In an implementation, the method of manufacturing a display device according to an embodiment may increase the flow rate by two times, instead of reducing time in each stage, to help prevent tack time from increasing while maintaining effects of same level. For example, in the first treatment operation (S131), the flow rate of the mixed gas of $N_2$ and $O_2$ may be about 200 sccm.

Electric power (e.g., wattage) among the plasma processing conditions in the second treatment operation S132 may be lower than that in the first treatment operation S131. For example, when the treatment conditions become relatively severe, a driving voltage of a display device may be increased. In an implementation, the electric power applied in the second treatment operation (S132) may be lower than that in the first treatment operation (S131). In an implementation, the electrical power applied in the first treatment operation may be, e.g., about 700 W to about 900 W. In an implementation, the electrical power applied in the second treatment operation may be, e.g., about 300 W to about 600 W.

A pressure (among the treatment conditions in the first treatment operation (S131)) may be, e.g., about 0.3 Pa to less than about 1 Pa. A pressure (among the treatment conditions in the second treatment operation (S132)) may be, e.g., about 0.3 Pa to less than about 1 Pa. In some other methods in which only one-stage of a surface treatment operation is performed before providing the organic layer on the first electrode, a pressure among the plasma treatment conditions may be about 1 Pa. In an implementation, although a pressure may be provided at an equal level or lower level than the other methods, a desired effect may still be effectively realized.

Figure 3H:
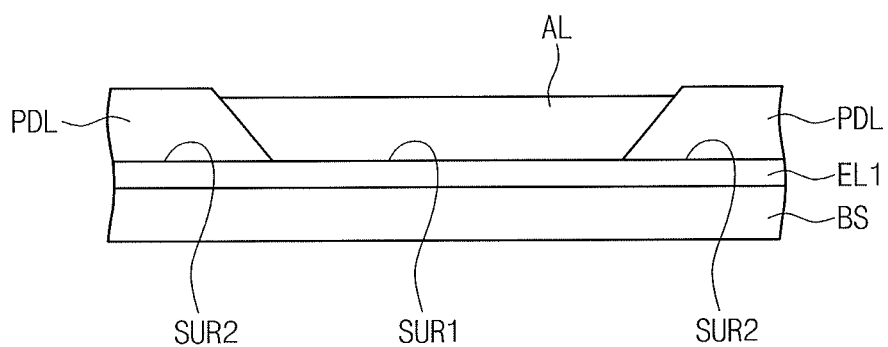

Next, referring to FIGS. 1, 3G, and 3H, providing the organic layer AL on the first electrode EL1 (S140) may be performed. Providing the organic layer AL on the first electrode EL1 (S140) may be performed in a suitable manner. For example, providing the organic layer AL (S140) may provide an organic layer AL on a surface SUR1 of the first electrode EL1 exposed by the pixel defining layer PDL. For example, FIG. 3G illustrates a cross-sectional view in which a fluoride ion has been removed from the exposed surface SUR1 of the first electrode EL1 after performing the second treatment operation (S132). FIG. 3H illustrates a cross-sectional view in which an organic layer AL is stacked on the surface SUR1 of the first electrode EL1 from which the fluoride ion (F in FIG. 3G) has been removed.

The organic layer AL may have a stacked structure of one or more layers. For example, the organic layer AL may include an emission layer. In an implementation, the organic layer AL may further include a hole transport region and an electron transport region.

The hole transport region may be provided on the first electrode EL1. The hole transport region may include at least one of a hole injection layer, a hole transport layer, a hole buffer layer, and an electron blocking layer.

The hole transport may have a single layer structure formed of a single material, a single layer structure formed of materials different form each other, or a multi-layered structure including a plurality of layers formed of materials different from each other.

The hole transport region may be formed by using any of a variety of methods, e.g., a vacuum deposition method, a spin coating method, a casting method, a Langmuir-Blodgett method, an inkjet printing method, a laser printing method, and a laser induced thermal imaging (LITI) method.

The emission layer may be provided on the hole transport region. The emission layer may have a single layer structure formed of a single material, a single layer structure formed of a plurality of materials different form each other, or a multi-layered structure including a plurality of layers formed of materials different from each other.

In an implementation, the emission layer may be formed of a suitable emission material, e.g., a material emitting red, green, or blue light, and may include a fluorescent material or a phosphorescent material. In an implementation, the emission layer may include a host material and a dopant material.

The electron transport region may be provided on the emission layer. The electron transport region may include, e.g., at least one of the hole blocking layer, the electron transport layer, and the electron injection layer.

The method of manufacturing a display device according to an embodiment may further include providing the second electrode on the organic layer AL after providing an organic layer AL (S140).

The second electrode may be specifically provided on the electron transport region. The second electrode may be a common electrode or a cathode. The second electrode may be a transmissive electrode, a transflective electrode, or a reflective electrode.

In an implementation, the method of manufacturing a display device according to an embodiment may include an additional process as desired. For example, the pretreatment process (S130) may include rinsing the base substrate BS, drying the base substrate BS, or the like, as desired.

Hereinafter, a method of manufacturing a display device according to another embodiment will be described with reference to FIGS. 4 to 6F. Hereinafter, a detailed description centered on differences from the above described method of manufacturing a display device according to an embodiment will be provided, and elements that are not described may be deemed described by the above description.

Figure 4:
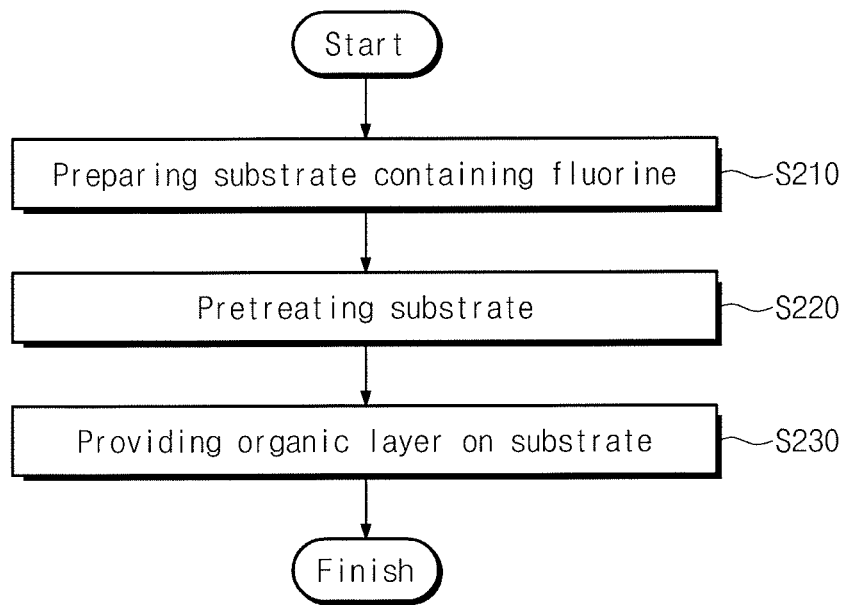

FIG. 4 schematically illustrates a flow diagram of a method of manufacturing a display device according to an embodiment.

Figure 5:
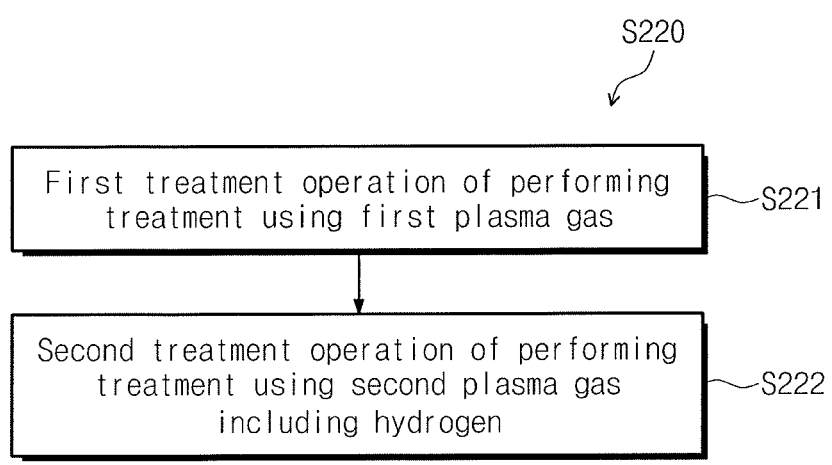

FIG. 5 schematically illustrates a flow diagram of a pretreating operation in a method of manufacturing a display device according to an embodiment.

FIGS. 6A to 6F illustrate cross-sectional views of stages in a method of manufacturing a display device according to an embodiment.

A method of manufacturing a display device according to an embodiment may include preparing a substrate SUB containing fluorine 10 (S210), pretreating the substrate SUB (S220), and providing an organic layer AL on the substrate SUB (S230) after pretreating the substrate.

Referring to FIGS. 5 and 6A to 6E, pretreating the substrate SUB (S220) may include performing a first treatment operation (S221) of treating a surface of the fluorine-containing substrate SUB using a first plasma gas PS1 and performing a second treatment operation (S222) of treating the surface, which has been surface-treated in the first treatment operation, of the substrate SUB using a second plasma gas PS2.

Figure 6A:
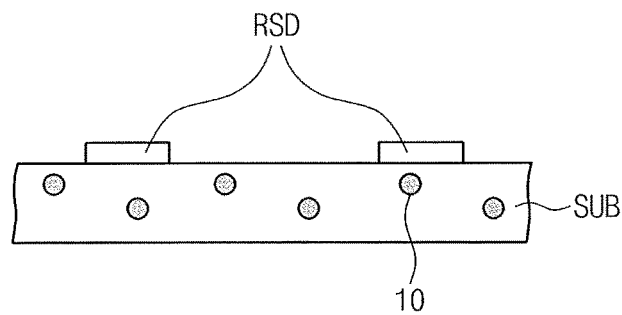
FIGS. 6A to 6F illustrate cross-sectional views of stages in a method of manufacturing a display device according to an embodiment.
Figure 6B:
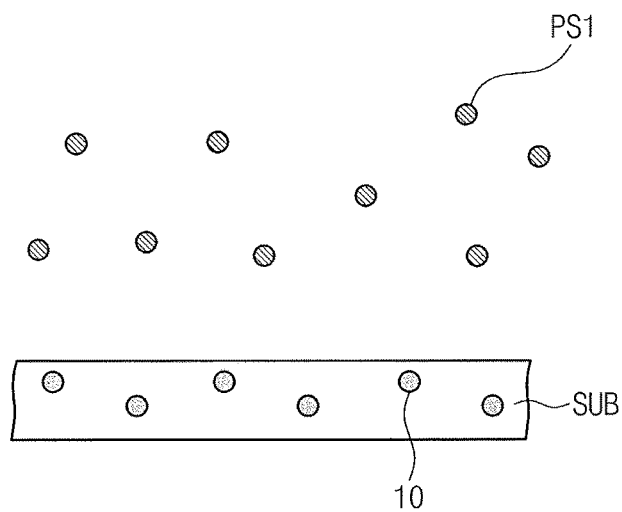
Figure 6C:
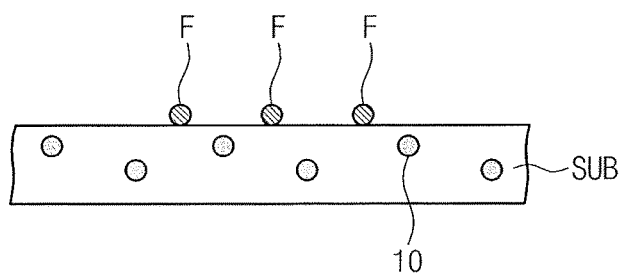
Figure 6D:
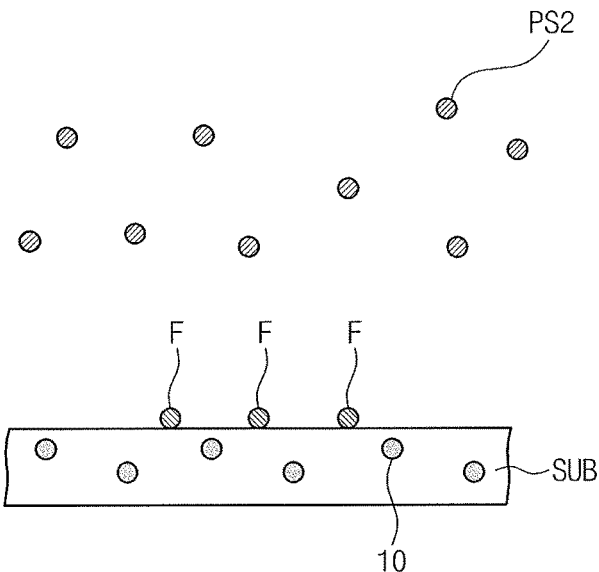
Figure 6E:
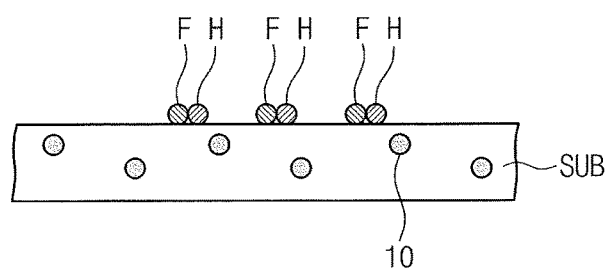

Referring to FIGS. 6A and 6B, the first treatment operation (S221) may include removing an undesired residue RSD from the surface of the substrate SUB. Referring to FIGS. 6C to 6E, the second treatment operation (S222) may include removing a fluoride ion created in and remaining from the first treatment operation. The fluoride ion F may be an ion that is activated when fluoride 10 in the substrate SUB is attacked by the first plasma gas PS1 during the first treatment operation S221.

The second plasma gas PS2 may be different from the first plasma gas PS1, and may include hydrogen in order to remove the fluoride ion F. For example, the second plasma gas PS2 may be a hydrogen-containing gas.

The substrate SUB may include a suitable material that contains fluorine. In an implementation, referring to FIG. 3B, the substrate SUB may include, e.g., a base substrate BS, a first electrode EL1 on the base substrate BS, and a pixel defining layer PDL on the base substrate BS and the first electrode EL1, the pixel defining layer PDL exposing at least a portion of the first electrode.

Figure 6F:
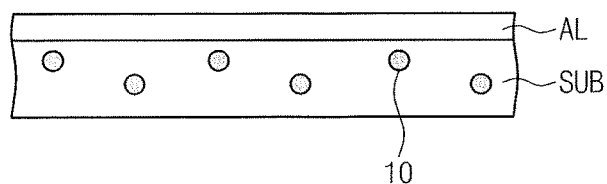

Referring to FIG. 6F, providing the organic layer AL may be performed after pretreating the substrate SUB (S220). Providing the organic layer AL may be performed according to a suitable method. A description regarding the organic layer AL may be the same as the above description, and thus is not repeated.

The above description about the method described in the previous embodiments of the present disclosure may be equally applied to a description of each stage in this embodiment.

By way of summation and review, as the organic light emitting display is widely spread, long lifespan of the organic light emitting display has been considered.

Some other methods of manufacturing a display device may include performing only a surface treatment operation (plasma treatment operation) in order to remove an undesired material remaining on a surface of the first electrode before providing an organic layer on the first electrode, and may not include a surface treatment operation to prevent a device from being deteriorated by removing a fluoride ion. For example, some other methods of manufacturing a display device may include performing only a one-stage plasma treatment before providing the organic layer on the first electrode. However, the pixel defining layer may contain fluorine, and the fluorine may be changed to an activated fluoride ion (during the surface treatment) and may accelerate deterioration of a device.

Unlike the other methods, the method of manufacturing a display device according to an embodiment may include a second surface treatment operation that includes removing an activated fluoride ion (after the first surface treatment operation of removing an impurity on the first electrode), thus being able to provide a display device with increased lifespan.

The method of manufacturing a display device according to an embodiment may manufacture a display device with increased lifespan.

The method of manufacturing a display device according to an embodiment may include removing a fluoride ion, e.g., which fluoride ions may cause deterioration of a display device, thus having an advantage of manufacturing a display device with long lifespan.

The embodiments may provide a method of manufacturing a display device that may enhance lifespan of the display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a display device, the method comprising:
providing a first electrode on a base substrate;
providing a fluorine-containing pixel defining layer on the base substrate and the first electrode such that the pixel defining layer exposes at least a portion of the first electrode;
pretreating the first electrode; and
providing an organic layer on the first electrode after pretreating the first electrode,
wherein pretreating the first electrode includes:
performing a first treatment operation of treating an exposed surface of the first electrode using a first plasma gas; and
performing a second treatment operation after performing the first treatment operation, the second treatment operation including treating the exposed surface of the first electrode using a second plasma gas, wherein the second plasma gas is different from the first plasma gas and includes hydrogen.

2. The method as claimed in claim 1, wherein:
the first plasma gas includes a mixed gas of $N_2$ and $O_2$, and
the second plasma gas includes a mixed gas of $N_2$ and $H_2$.

3. The method as claimed in claim 2, wherein a ratio of $H_2$ in the mixed gas of $N_2$ and $H_2$ is about 10% to about 30%.

4. The method as claimed in claim 1, wherein:
the first treatment operation is performed for about 35 seconds to about 45 seconds, and
the second treatment operation is performed for about 15 seconds to about 25 seconds.

5. The method as claimed in claim 1, wherein a power applied in the second treatment operation is lower than a power applied in the first treatment operation.

6. The method as claimed in claim 1, wherein:
a power applied in the first treatment operation is about 700 W to about 900 W, and
a power applied in the second treatment operation is about 300 W to about 600 W.

7. The method as claimed in claim 1, wherein:
performing the first treatment operation includes removing a residual material from the exposed surface of the first electrode, the residual material having been created during providing the pixel defining layer, and
performing the second treatment includes removing a fluoride ion from the exposed surface of the first electrode, the fluoride ion having been created during the first treatment operation.

8. The method as claimed in claim 7, wherein performing the second treatment operation includes forming a hydrogen bond between the fluoride ion and the second plasma gas.

9. A method of manufacturing a display device, the method comprising:
preparing a substrate that contains fluorine;
pretreating the substrate; and
providing an organic layer on the substrate after pretreating the substrate,
wherein pretreating the substrate includes:
performing a first treatment operation of treating a surface of the substrate using a first plasma gas; and
performing a second treatment operation after performing the first treatment operation, the second treatment operation including treating the surface of the substrate using a second plasma gas, wherein the second plasma gas is different from the first plasma gas and includes hydrogen.

10. The method as claimed in claim 9, wherein:
the first plasma gas includes a mixed gas of $N_2$ and $O_2$, and
the second plasma gas includes a mixed gas of $N_2$ and $H_2$.

11. The method as claimed in claim 10, wherein a ratio of $H_2$ in the mixed gas of $N_2$ and $H_2$ is about 10% to about 30%.

12. The method as claimed in claim 9, wherein:
the first treatment operation is performed for about 35 seconds to about 45 seconds, and
the second treatment operation is performed for about 15 seconds to about 25 seconds.

13. The method as claimed in claim 9, wherein a power applied in the second treatment operation is lower than a power applied in the first treatment operation.

14. The method as claimed in claim 9, wherein:
a power applied in the first treatment operation is about 700 W to about 900 W, and
a power applied in the second treatment operation is about 300 W to about 600 W.

15. The method as claimed in claim 9, wherein performing the second treatment operation includes removing a fluoride ion from the surface of the substrate, the fluoride ion having been created in the first treatment operation.

16. The method as claimed in claim 15, wherein performing the second treatment operation includes forming a hydrogen bond between the fluoride ion and the second plasma gas.

* * * * *